(12) United States Patent
Huang

(10) Patent No.: US 11,566,323 B2
(45) Date of Patent: Jan. 31, 2023

(54) FINE METAL MASK AND METHOD FOR MANUFACTURING THE SAME, MASK ASSEMBLY AND DISPLAY SUBSTRATE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventor: Shihsyong Huang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/998,457

(22) Filed: Aug. 20, 2020

(65) Prior Publication Data

US 2021/0147976 A1    May 20, 2021

(30) Foreign Application Priority Data

Nov. 20, 2019   (CN) .......................... 201911141653.0

(51) Int. Cl.
| | |
|---|---|
| *C23C 16/04* | (2006.01) |
| *H01L 27/32* | (2006.01) |
| *G06F 1/18* | (2006.01) |
| *C23C 14/04* | (2006.01) |
| *B05C 21/00* | (2006.01) |

(52) U.S. Cl.
CPC .......... *C23C 16/042* (2013.01); *B05C 21/005* (2013.01); *C23C 14/042* (2013.01); *G06F 1/189* (2013.01); *H01L 27/3276* (2013.01)

(58) Field of Classification Search
None
See application file for complete search history.

(56) References Cited

U.S. PATENT DOCUMENTS

| | | | |
|---|---|---|---|
| 9,666,837 B2* | 5/2017 | Lee | ......................... B05C 21/005 |
| 9,711,724 B2* | 7/2017 | Baek | ....................... B05C 21/005 |
| 10,084,133 B2* | 9/2018 | Chen | ....................... C23C 14/042 |
| 2005/0053764 A1 | 3/2005 | Nakadate | |

(Continued)

FOREIGN PATENT DOCUMENTS

| | | |
|---|---|---|
| CN | 107385392 A | 11/2017 |
| CN | 107636191 A | 1/2018 |

(Continued)

OTHER PUBLICATIONS

First Office Action for Chinese Application No. 201911141653.0, dated Apr. 16, 2021, 10 Pages.

*Primary Examiner* — Jethro M. Pence
(74) *Attorney, Agent, or Firm* — Brooks Kushman P.C.

(57) ABSTRACT

The present disclosure provides a fine metal mask and a method for manufacturing the same, a mask assembly and a display substrate. The fine metal mask includes: a mask pattern region and a non-mask region disposed at a periphery of the mask pattern region. The mask pattern region includes at least one first grid pattern region, a barrier ring pattern disposed around the first grid pattern region, and a second grid pattern region disposed at an outer periphery of the barrier ring pattern.

19 Claims, 7 Drawing Sheets

(56) References Cited

U.S. PATENT DOCUMENTS

2011/0229633 A1* 9/2011 Hong .................. H01L 51/0011
427/162
2016/0322572 A1* 11/2016 Chen .................... C23C 14/042
2020/0020861 A1   1/2020 Han et al.

FOREIGN PATENT DOCUMENTS

| CN | 108642441 A | 10/2018 |
| CN | 109943808 A | 6/2019 |
| CN | 110453173 A | 11/2019 |

* cited by examiner

FINE METAL MASK AND METHOD FOR MANUFACTURING THE SAME, MASK ASSEMBLY AND DISPLAY SUBSTRATE

CROSS-REFERENCE TO RELATED APPLICATION

This application claims priority to Chinese Application No. 201911141653.0, filed on Nov. 20, 2019, which is incorporated herein by reference in its entirety.

TECHNICAL FIELD

The present disclosure relates to the field of display technologies, and in particular to a fine metal mask and a method for manufacturing the same, a mask assembly and a display substrate.

BACKGROUND

In related art, a light-emitting unit in an organic light-emitting diode (OLED) is usually formed by vapor evaporation. However, it is difficult to realize a slim border for an OLED display substrate formed by vapor evaporation with a mask in the related art.

SUMMARY

According to a first aspect, one embodiment of the present disclosure provides a fine metal mask, including: a mask pattern region and a non-mask region disposed at a periphery of the mask pattern region. The mask pattern region includes at least one first grid pattern region, a barrier ring pattern disposed around the first grid pattern region, and a second grid pattern region disposed at an outer periphery of the barrier ring pattern.

Optionally, a thickness of the barrier ring pattern is less than a thickness of the non-mask region.

Optionally, the thickness of the barrier ring pattern is equal to 0.4 to 0.8 of the thickness of the non-mask region.

Optionally, the mask pattern region includes N first grid pattern regions, and N is a positive integer greater than or equal to 2.

Optionally, the barrier ring pattern is between the first grid pattern region and the second grid pattern region.

Optionally, the first grid pattern region includes a plurality of grids; and each of the plurality of grids is corresponding to a light-emitting unit of a display substrate.

Optionally, in a direction perpendicular to a plane where the fine metal mask plate is located, a thickness of the barrier ring pattern is less than a thickness of each of the plurality of grids.

Optionally, the barrier ring pattern is an annular structure of a continuous wire; in a plane parallel to the fine metal mask, in a line width direction perpendicular to an extension direction of each portion of the wire, a line width of each portion of the wire is greater than or equal to a size in the line width direction of one of the plurality of grids.

Optionally, in the direction perpendicular to the plane where the fine metal mask plate is located, the thickness of each of the plurality of grids is equal to a thickness of the non-mask region.

Optionally, the mask pattern region includes a plurality of first grid pattern regions; and the plurality of first grid pattern regions are arranged in multiple rows and multiple columns.

Optionally, each of the plurality of first grid pattern regions is circular, and the barrier ring pattern is a circular ring.

According to a second aspect, one embodiment of the present disclosure provides a mask assembly, including: the above fine metal mask and an open mask. The fine metal mask is stacked on the open mask; the open mask includes a frame, a mask body disposed on the frame, and at least one opening region defined in the mask body. The opening region and the first grid pattern region have the same shape and are correspondingly arranged; an orthographic projection of an edge of the opening region to the fine metal mask falls within the barrier ring pattern at the periphery of the corresponding first grid pattern region.

Optionally, the orthographic projection of the edge of the opening region to the fine metal mask falls at a middle position of the barrier ring pattern at the periphery of the corresponding first grid pattern region.

Optionally, the open mask includes M×N opening regions, N is the number of first grid pattern regions of one fine metal mask, and M is the number of the fine metal masks; M fine metal masks are arranged in an array; N is a positive integer greater than or equal to 2, and M is a positive integer greater than or equal to 2.

Optionally, the barrier ring pattern is between the first grid pattern region and the second grid pattern region.

Optionally, the first grid pattern region includes a plurality of grids; and each of the plurality of grids is corresponding to a light-emitting unit of a display substrate.

Optionally, in a direction perpendicular to a plane where the fine metal mask plate is located, a thickness of the barrier ring pattern is less than a thickness of each of the plurality of grids.

Optionally, the barrier ring pattern is an annular structure of a continuous wire; in a plane parallel to the fine metal mask, in a line width direction perpendicular to an extension direction of each portion of the wire, a line width of each portion of the wire is greater than or equal to a size in the line width direction of one of the plurality of grids.

According to a third aspect, one embodiment of the present disclosure provides a method for manufacturing a fine metal mask, including: forming a fine metal mask in such a manner that the fine metal mask includes a mask pattern region and a non-mask region disposed at a periphery of the mask pattern region, the mask pattern region includes at least one first grid pattern region, a barrier ring pattern disposed around the first grid pattern region, and a second grid pattern region disposed at an outer periphery of the barrier ring pattern.

Optionally, the forming a fine metal mask includes: providing mask material; coating a photoresist on the mask material; etching the photoresist with a halftone or gray-tone mask to form a photoresist full-reserved area, a photoresist partial-reserved area and a photoresist fully-removed area; etching the mask material in the photoresist fully-removed area to form the first grid pattern region and the second grid pattern region; removing all the photoresist in the photoresist partial-reserved area, and removing a certain thickness of photoresist from the photoresist in the photoresist full-reserved area; etching the mask material in the photoresist partial-reserved area to form the barrier ring pattern; removing remaining photoresist.

BRIEF DESCRIPTION OF THE DRAWINGS

In order to explain the technical solutions of the embodiments of the present disclosure more clearly, the drawings used in the description of the embodiments of the present disclosure are briefly introduced below. Obviously, the drawings in the following description are just some embodiments of the present disclosure. For those of ordinary skill in the art, other drawings can be obtained based on these drawings without paying creative labor.

DETAILED DESCRIPTION

In order to make the objects, features and the advantages of the present disclosure more apparent, the present disclosure will be described hereinafter in a clear and complete manner in conjunction with the drawings and embodiments.

In related art, a light-emitting unit in an organic light-emitting diode (OLED) is usually formed by vapor evaporation. A mask assembly used during vapor evaporation usually includes a fine metal mask (FMM) and an open mask (or referred as a common mask) that are stacked on each other. In order to avoid influence of manufacturing precision and tension precision of the open mask, a size of an opening area of the open mask should be greater than that of a display opening area (i.e., active area, referred as AA) of the fine metal mask, so that the display opening area of the fine metal mask will not be blocked by the open mask during vapor evaporation. Meanwhile, it is further necessary to design the same grid pattern in an area outside the display opening area of the fine metal mask as that in the display opening area, and this area may also referred to be as a dummy area. The presence of the dummy area will form a dummy display area on the OLED display substrate, resulting in reduction of a circuit contact area at a peripheral area of the display substrate. If the circuit contact area is too small, there may be circuit connection problems. If the size of the circuit contact area is to be maintained, it is necessary to increase a size of a border of the display substrate, and thus it is difficult to realize a slim border.

Figure 1:
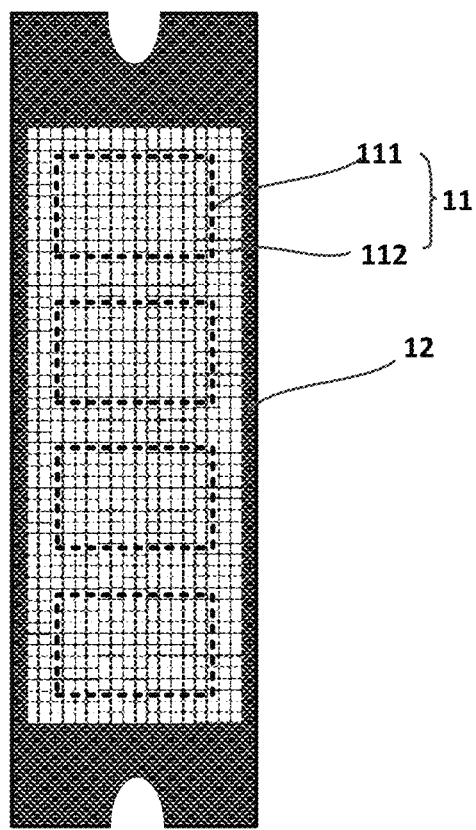
FIG. 1 is a schematic diagram of a fine metal mask in the related art.

FIG. 1 is a schematic diagram of a fine metal mask in the related art. Referring to FIG. 1, a fine metal mask 10 includes a mask pattern region 11 and a non-mask region 12 disposed at a periphery of the mask pattern region 11. The mask pattern region 11 includes at least one display opening area 111 (a portion enclosed by a dotted frame) and a dummy area 112 disposed at a periphery of the display opening area 111. Each display opening area 111 is corresponding to an active area (AA) of a display substrate. Each metal grid in the display opening area 111 is corresponding to a light-emitting unit of the display substrate. The fine metal mask shown in FIG. 1 includes four display opening areas 111, which may be used for performing vapor evaporation of light-emitting units of four display substrates simultaneously. The dummy area 112 has the same grid pattern as the display opening area 111. It should be understood that the dotted frame in FIG. 1 does not exist, that is, the fine metal mask cannot define the display opening area 111 and the dummy area 112, and thus the fine metal mask needs to cooperate with an open mask to define the display opening area 111 by the open mask.

Figure 2:
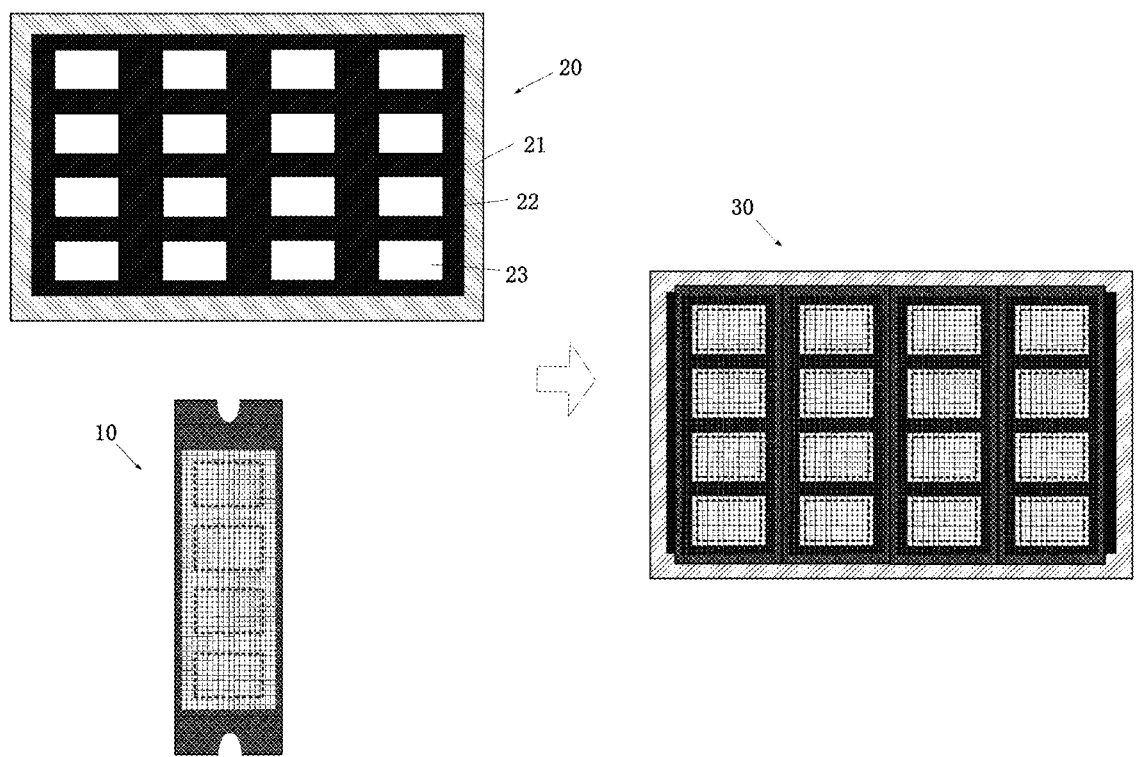
FIG. 2 is a schematic diagram of a mask assembly in the related art.
Figure 3:
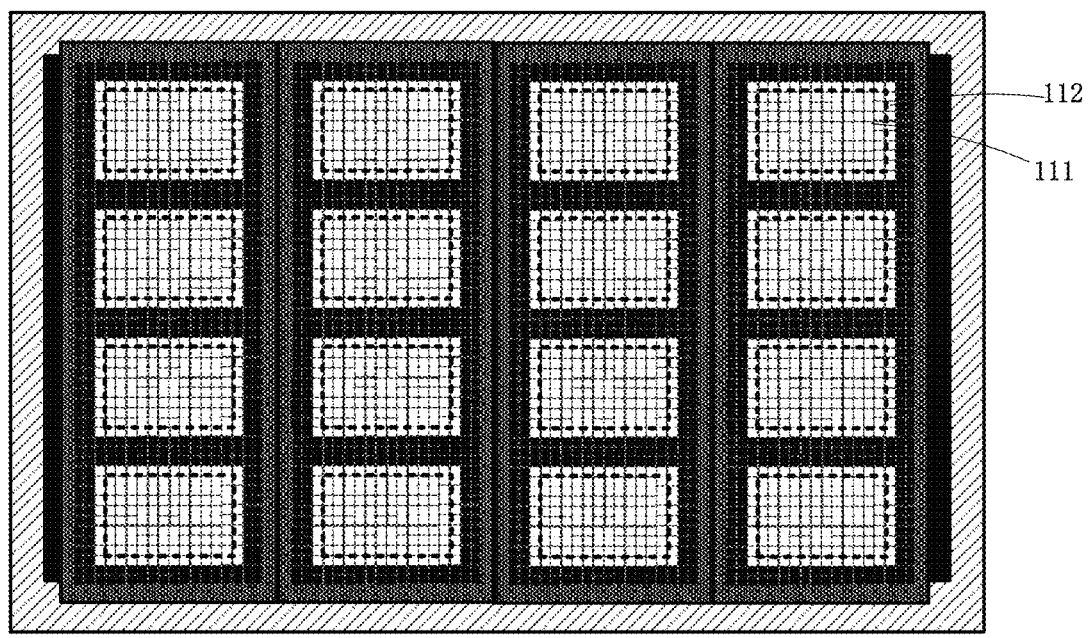
FIG. 3 is a schematic diagram of a mask assembly in the related art.
Figure 4:
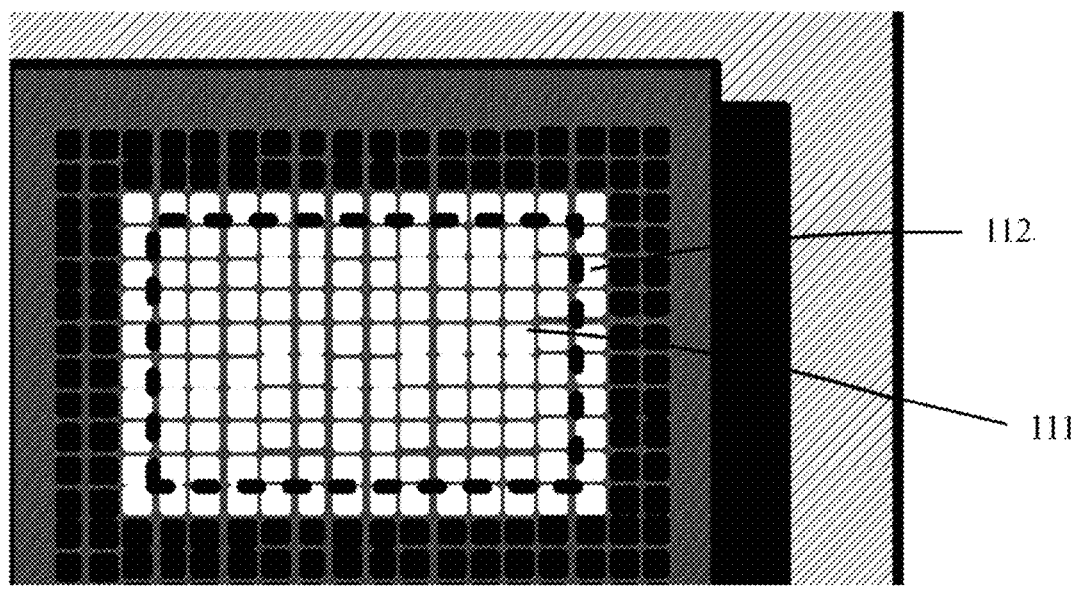
FIG. 4 is a partially enlarged view of the mask assembly shown in FIG. 3.

FIG. 2 to FIG. 4 are schematic diagrams of a mask assembly in the related art. Referring to FIG. 2 to FIG. 4, a mask assembly 30 includes the fine metal mask 10 as shown in FIG. 1 and an open mask 20 that are stacked on each other. As shown in FIG. 2 to FIG. 4, the mask assembly 30 includes one open mask 20 and four fine metal masks 10 arranged in an array. The open mask 20 is used to define the display opening area of the fine metal mask. The open mask 20 includes a frame 21, a mask body 22 disposed on the frame 21, and opening regions 23 defined in the mask body 22. The opening region 23 is used to define the display opening area of the fine metal mask. Ideally, a size of the opening region 23 should be the same as the size of the display opening area 111 of the fine metal mask. However, due to the influence of the manufacturing accuracy and tension accuracy of the open mask, it is necessary to design the size of the opening region 23 greater than that of the display opening area (AA area) of the fine metal mask 10, thereby preventing the display opening area of the fine metal mask from being blocked by the open mask when the fine metal mask is stacked on the open mask. Meanwhile, a dummy area is further provided in the fine metal mask to deal with poor vapor deposition caused by poor alignment accuracy of the fine metal mask and the open mask. As shown in FIG. 3 and FIG. 4, after the fine metal mask 10 is stacked on the open mask 20, since the size of the opening region 23 of the open mask 20 is greater than the size of the display opening area 111 of the fine metal mask 10, the display opening area 111 and a part of the dummy area 12 of the fine metal mask 10 are exposed from the opening region 23 of the open mask 20.

Figure 5:
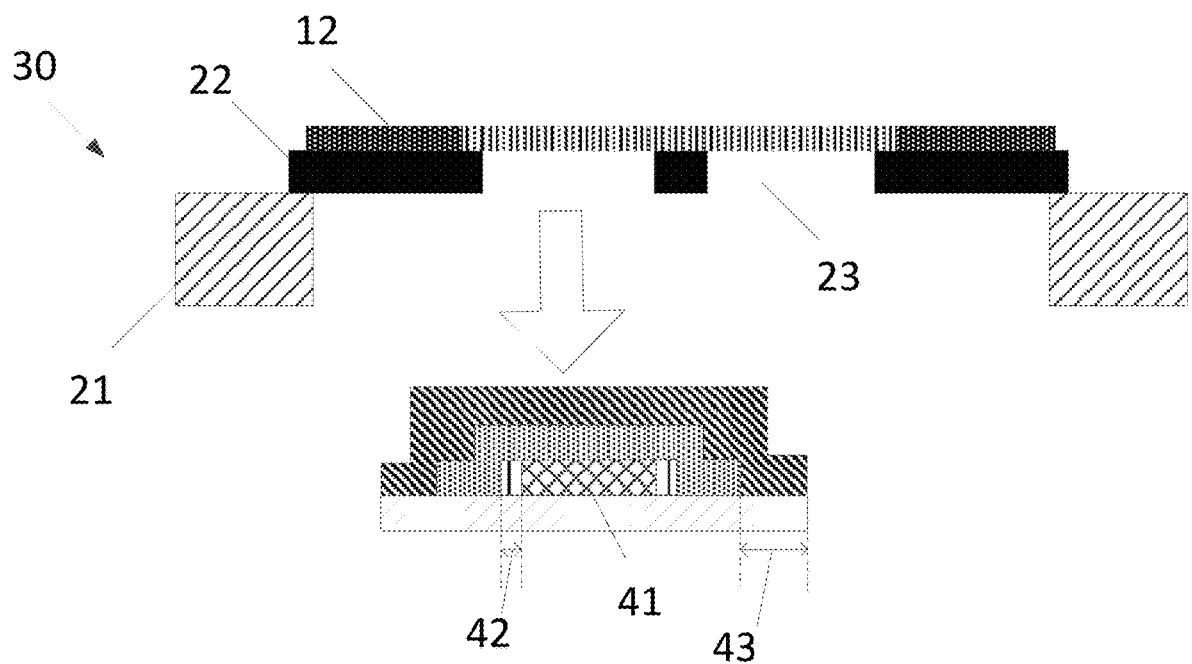
FIG. 5 is a schematic diagram of manufacturing an OLED display substrate by using a mask assembly in the related art.

Referring to FIG. 5, FIG. 5 is a schematic diagram of manufacturing an OLED display substrate by using a mask assembly in the related art. As can be seem from FIG. 5, a formed OLED display substrate includes a display area 41 and a dummy display area located outside the display area 41. The display area 41 is corresponding to the display opening area 111 of the fine metal mask 10, and has a design size of the display area. The dummy display area 42 is corresponding to a part of the dummy area 112 of the fine metal mask 10, and is a poor vapor evaporation area. Due to the presence of the dummy display area 42, a size of a circuit contact area 43 of the OLED display substrate is bound to be reduced. If the size of the circuit contact area 43 is to be maintained, a size of a border of the OLED display substrate needs to be increased, which is not conducive to realization of slim border.

In order to solve the above problems, one embodiment of the present disclosure provides a fine metal mask and a method for manufacturing the same, a mask assembly and a display substrate, which will be described in detail hereinafter.

Figure 6:
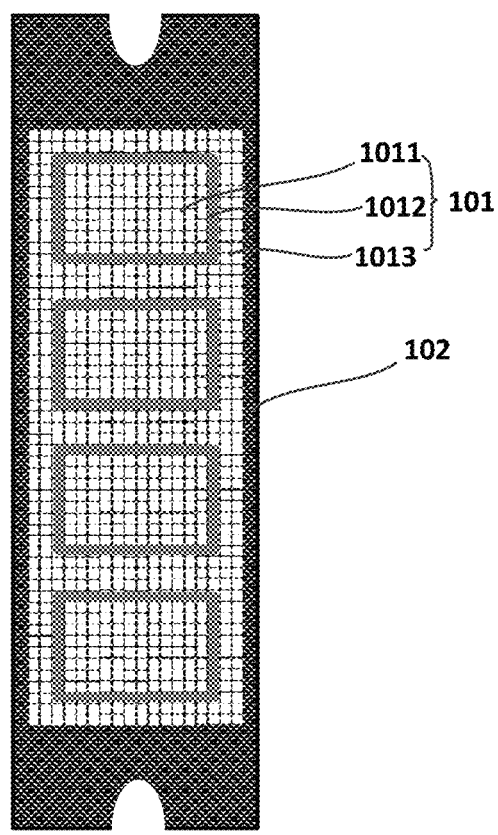
FIG. 6 is a schematic diagram of a fine metal mask according to an embodiment of the present disclosure.

FIG. 6 is a schematic diagram of a fine metal mask according to an embodiment of the present disclosure. Referring to FIG. 6, the fine metal mask includes a mask pattern region 101 and a non-mask region 102 disposed at a periphery of the mask pattern region 101. The mask pattern region 101 includes: at least one first grid pattern region 1011 (a portion surrounded by a dotted frame), a barrier ring pattern 1012 disposed around the first grid pattern region 1011, and a second grid pattern region 1013 disposed at an outer periphery of the barrier ring pattern 1012.

The first grid pattern region 1011 is corresponding to the display opening area 111 in FIG. 1. Each first grid pattern region 1011 is corresponding to an active area (AA) of a display substrate. Each grid such as metal grid (which, for example, is defined and surrounded by first bars 101101 and second bars 101102) in the first grid pattern region 1011 is corresponding to a light-emitting unit of the display substrate. The second grid pattern region 1013 is corresponding to the dummy area 112 in FIG. 1. The second grid pattern region 1013 has a same grid pattern as the first grid pattern region 1011. The function of the second grid pattern region 1013 is that in the tension process, stretching the fine metal mask will cause the first grid pattern region 1011 to generate lateral pressure, and the presence of the second grid pattern region 1011 around the first grid pattern region 1011 can make the lateral pressure more uniform and not easy to produce wrinkles.

In one embodiment of the present disclosure, when the fine metal mask is mounted onto the open mask, the presence of the barrier ring pattern in the fine metal mask can block dimensional deviation of the opening region of the open mask due to manufacturing accuracy and tension accuracy of the open mask, thereby avoiding the influence of the manufacturing accuracy and tension accuracy of the open mask onto the vapor evaporation process. Meanwhile, in the vapor evaporation process, the barrier ring pattern can prevent some evaporated material from passing through, so that a dummy display area will not be formed on the display substrate, and then a circuit contact area at a periphery of the display area on the display substrate can be approached to the display area, thereby achieving a slim border.

Figure 11:
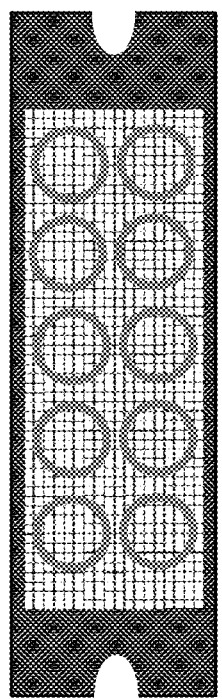
FIG. 11 is a schematic diagram of a fine metal mask according to another embodiment of the present disclosure.
Figure 12:
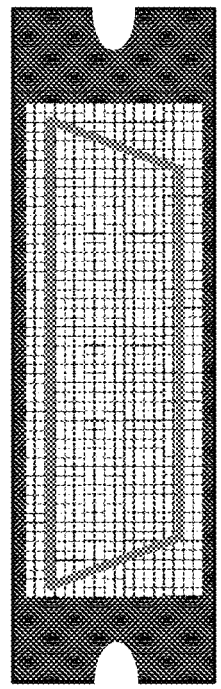
FIG. 12 is a schematic diagram of a fine metal mask according to yet another embodiment of the present disclosure.

In one embodiment of the present disclosure, optionally, a shape of an outer edge of the barrier ring pattern 1012 is the same as a shape of the first grid pattern region 1011. In the embodiment shown in FIG. 6, the shape of the first grid pattern region 1011 is rectangular, and the barrier ring pattern 1012 is a rectangular ring. In other embodiments of the present disclosure, the first grid pattern region may also have other shapes, such as a circle, a square, a triangle, a rhombus, an ellipse, a pentagon, and a hexagon. Referring to FIG. 11, the first grid pattern region is circular, and accordingly, the barrier ring pattern 1012 is a circular ring. In addition, the first grid pattern region may also have an irregular shape, such as a waterdrop panel shape and a notch panel shape. Referring to FIG. 12, the first grid pattern region has an irregular shape, and accordingly, the barrier ring pattern 1012 is also an irregular ring pattern.

In some embodiments of the present disclosure, the barrier ring pattern 1012 is an annular structure formed by a continuous wire. In a plane parallel to the fine metal mask, in a line width direction perpendicular to an extension direction of each portion of the wire, a line width of each portion of the wire is greater than or equal to a size in the line width direction of the grid in the first grid pattern region. For example, as shown in FIG. 6, the barrier ring pattern 1012 may be a rectangular ring structure formed by a continuous wire. In the plane parallel to the fine metal mask, for a horizontal extension section of the barrier ring pattern 1012, the extension direction thereof is the horizontal direction, the line width direction thereof is the vertical direction, and the line width of the horizontal extension section of the barrier ring pattern in the vertical direction is greater than a size of the grid in the vertical direction in the first grid pattern region. For a vertically extension section of the barrier ring pattern 1012, the extension direction thereof is the vertical direction, the line width direction thereof is the horizontal direction, and the line width of the vertically extension section of the barrier ring pattern in the horizontal direction is greater than a size of the grid in the horizontal direction in the first grid pattern region. In other words, it may also be understood as that wire material of the barrier ring pattern 1012 fills up the grids in the first grid pattern region through which the barrier ring pattern 1012 passes.

In some embodiments of the present disclosure, optionally, a thickness of the barrier ring pattern 1012 is less than a thickness of the non-mask region 102. The thickness of the non-mask region 102 is the thickness of the mask material itself. In some embodiments, the thickness of the barrier ring pattern 1012 refers to a size of the barrier ring pattern 1012 in a direction perpendicular to a plane where the fine metal mask plate is located, when the fine metal mask is in the position shown in FIG. 6. The thickness of the non-mask region 102 refers to a size of the non-mask region 102 in the direction perpendicular to the plane where the fine metal mask plate is located, when the fine metal mask is in the position shown in FIG. 6. The thickness of the grid in the first grid pattern region may also be the thickness of the mask material itself. In some embodiments of the present disclosure, the thickness of the grid in the first grid pattern region refers to a size of the grid in the direction perpendicular to the plane where the fine metal mask plate is located, when the fine metal mask is in the position shown in FIG. 6. In one embodiment of the present disclosure, by reducing the thickness of the barrier ring pattern 1012, it can avoid the problem of poor vapor deposition due to sagging of the fine metal mask caused by excessive weight of the barrier ring pattern 1012.

In one embodiment of the present disclosure, optionally, the thickness of the barrier ring pattern 1012 may be equal to 0.4 to 0.8 of the thickness of the non-mask region 102. Optionally, the barrier ring pattern 1012 may be formed by etching a back surface via a half-etching method, and the thickness of the barrier ring pattern 1012 may be equal to $\frac{2}{3}$ of the thickness of the non-mask region 102.

Of course, in some embodiments of the present disclosure, the thickness of the barrier ring pattern 1012 may also be equal to the thickness of the non-mask region 102. In this solution, the process of forming the barrier ring pattern 1012 is relatively simple.

In one embodiment of the present disclosure, optionally, the mask pattern region includes N first grid pattern regions 1011, where N is a positive integer greater than or equal to 2. In other words, one fine metal mask may be used for performing vapor evaporation of light-emitting units of N display substrates simultaneously, thereby improving evaporation efficiency.

The grids in the fine metal mask in one embodiment of the present disclosure may be metal grids. Of course, the grids may be made of other materials, which are not limited thereto.

Figure 7:
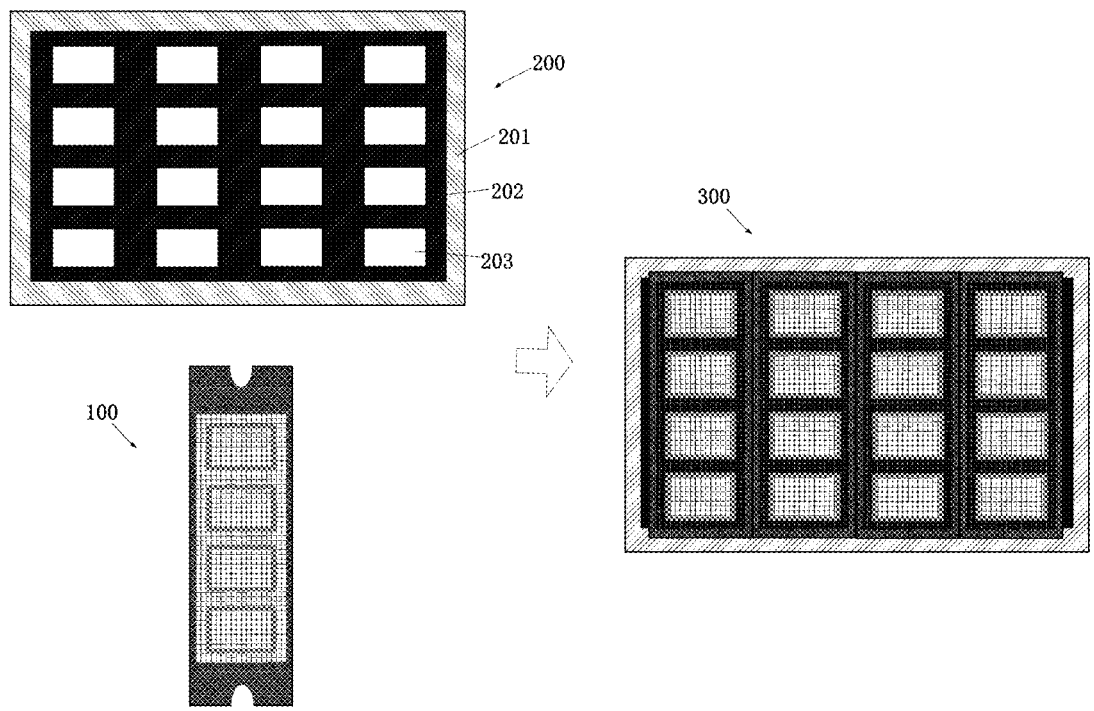
FIG. 7 is a schematic diagram of a mask assembly according to an embodiment of the present disclosure.
Figure 8:
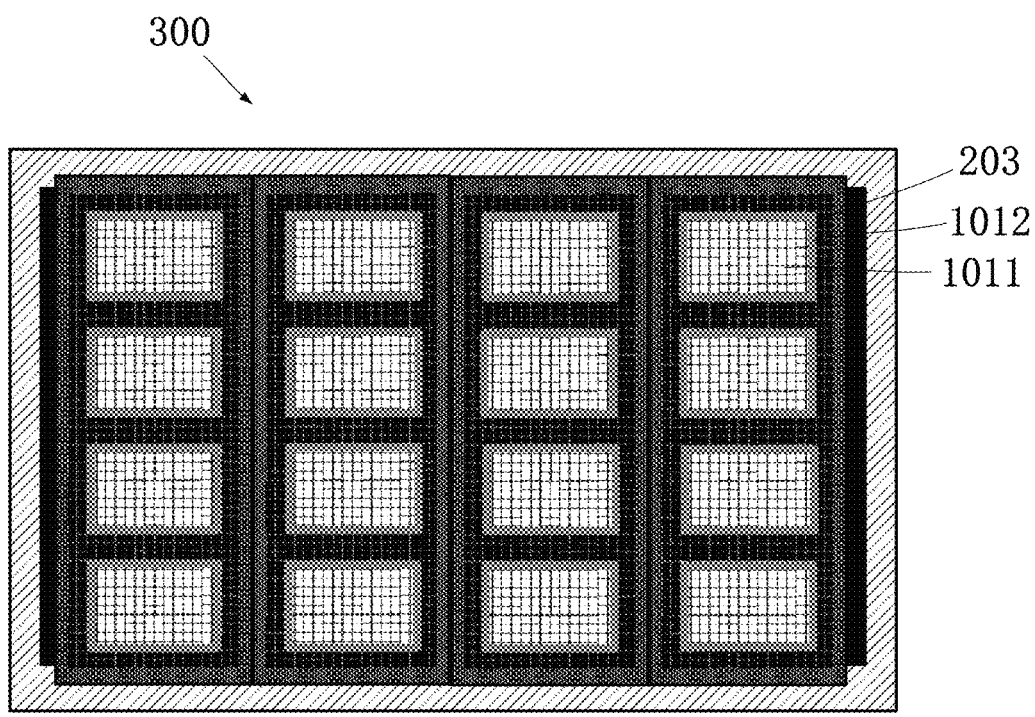
FIG. 8 is a schematic diagram of a mask assembly according to an embodiment of the present disclosure.
Figure 9:
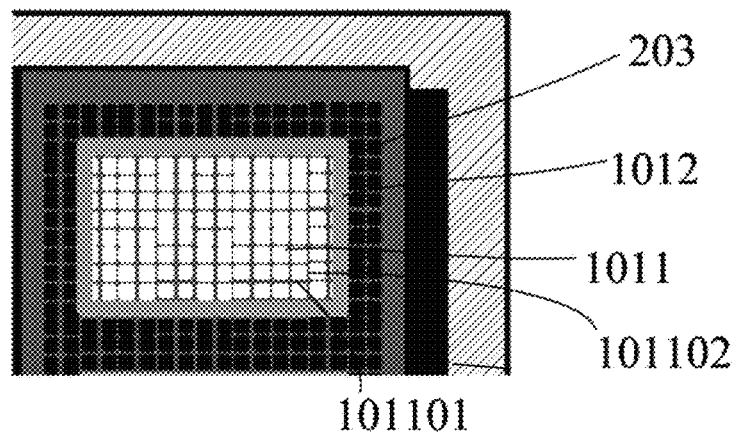
FIG. 9 is a partially enlarged view of the mask assembly shown in FIG. 8.

FIG. 7 and FIG. 8 are schematic diagrams of a mask assembly according to an embodiment of the present disclosure. As shown in FIG. 7 and FIG. 8, the mask assembly includes a fine metal mask 100 and an open mask 200 that are stacked on each other. The fine metal mask 100 employs the fine metal mask shown in FIG. 6. The open mask 200 includes a frame 201, a mask body 202 disposed on the frame 201, and opening regions 203 defined in the mask body 202. Ideally, a size of the opening region 203 should be the same as the size of the first grid pattern region of the fine metal mask. However, due to the influence of the manufacturing accuracy and tension accuracy of the open mask, it is necessary to design, it is necessary to design the size of the opening region 203 greater than that of the first grid pattern region of the fine metal mask 100, thereby preventing the first grid pattern region of the fine metal mask from being blocked by the open mask when the fine metal mask is stacked on the open mask.

In one embodiment of the present disclosure, the opening region 203 and the first grid pattern region 1011 of the fine metal mask 100 have the same shape and are correspondingly arranged. An orthographic projection of an edge of the opening region 203 to the fine metal mask 100 falls within the barrier ring pattern 1012 at the periphery of the corresponding first grid pattern region 1011. In other words, when the fine metal mask 100 is stacked on the open mask 200, the barrier ring pattern 1012 is at least partially exposed in the opening region of the open mask 200.

In one embodiment of the present disclosure, since the barrier ring pattern is provided in the fine metal mask, when the fine metal mask is stacked on the open mask, instead of the dummy area exposed from the opening region of the open mask in the related art, the barrier ring pattern can block dimensional deviation of the open mask due to manufacturing accuracy and tension accuracy of the open mask, thereby avoiding the influence of the manufacturing accuracy and tension accuracy of the open mask onto the vapor evaporation process. Meanwhile, in the vapor evaporation process, the barrier ring pattern can prevent some evaporated material from passing through, so that a dummy display area will not be formed on the display substrate, and then a circuit contact area at a periphery of the display area on the display substrate can be approached to the display area, thereby achieving a slim border.

Figure 10:
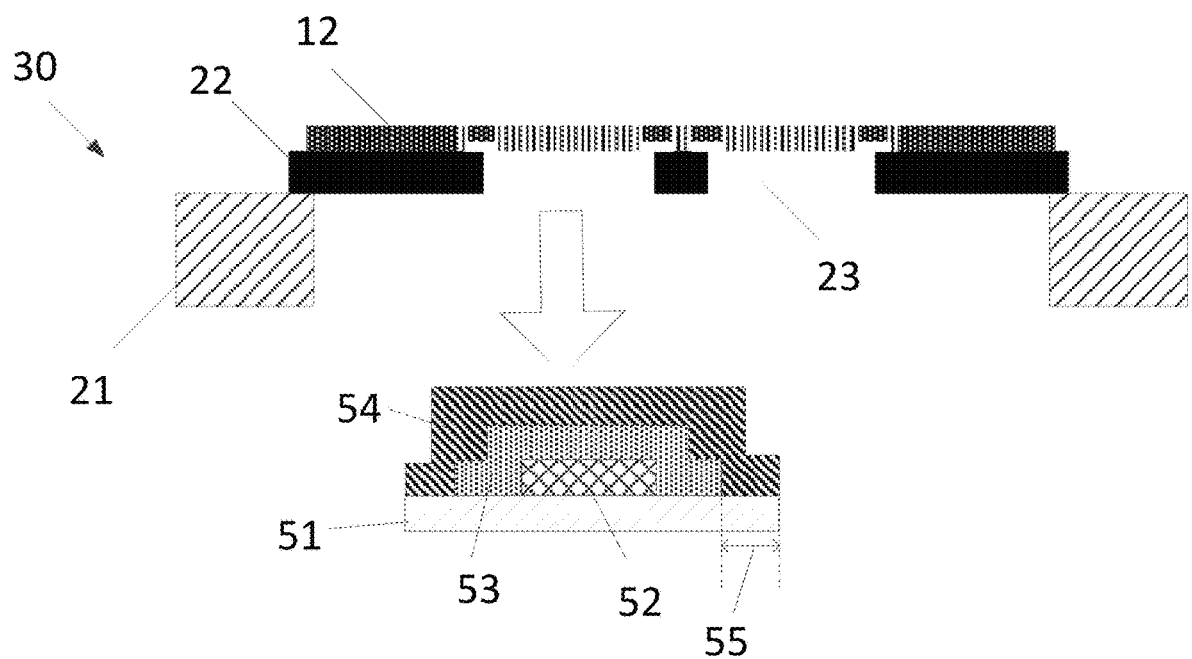
FIG. 10 is a schematic diagram of manufacturing an OLED display substrate by using a mask assembly according to an embodiment of the present disclosure.

In one embodiment of the present disclosure, optionally, the orthographic projection of the edge of the opening region 203 of the open mask 200 to the fine metal mask 100 falls at a middle position, such as a center line position as shown in FIG. 10, of the barrier ring pattern at the periphery of the corresponding first grid pattern region, thereby coping with dimensional deviation of the opening region in two directions.

In one embodiment of the present disclosure, optionally, the open mask includes M×N opening regions, where N is the number of the first grid pattern regions of the fine metal mask, and M is the number of the fine metal masks. M fine metal masks are arranged in an array. N is a positive integer greater than or equal to 2. M is a positive integer greater than or equal to 2. In this way, the mask assembly may be used for performing vapor evaporation of light-emitting units of multiple OLED display substrates simultaneously.

Referring to FIG. 10, FIG. 10 is a schematic diagram of manufacturing an OLED display substrate by using a mask assembly according to an embodiment of the present disclosure. As can be seem from FIG. 10, a formed OLED display substrate includes only a display area 52 and does not include a dummy display area. The display area 52 is corresponding to the first grid pattern region 1011 of the fine metal mask 100, and has a design size of the display area. Due to elimination of the dummy display area, a size of a circuit contact area 55 of the OLED display substrate is not reduced, and then there is no need to increase a size of a border of the OLED display substrate to maintain the size of the circuit contact area, which is conducive to the realization of a slim border. In addition, since the OLED display substrate has a slim border, in the process of manufacturing the OLED display substrate, more OLED display substrates may be arranged on a substrate such as glass substrate, thereby improving the utilization rate of the substrate.

In the embodiment shown in FIG. 10, the OLED display substrate includes: a substrate 51, a display area 52, a common layer 53, an anode 54, and a circuit contact area 55. The common layer 53 may include at least one of an electron transport layer, an electron injection layer, a hole transport layer and a hole injection layer.

One embodiment of the present disclosure further provides a method for manufacturing a fine metal mask, including:

Step 61: forming a fine metal mask in such a manner that the fine metal mask includes a mask pattern region and a non-mask region disposed at a periphery of the mask pattern region, the mask pattern region includes at least one first grid pattern region, a barrier ring pattern disposed around the first grid pattern region, and a second grid pattern region disposed at an outer periphery of the barrier ring pattern.

Optionally, the forming a fine metal mask includes:

Step 611: providing mask material;

Step 612: coating a photoresist on the mask material;

Step 613: etching the photoresist with a halftone or gray-tone mask to form a photoresist full-reserved area, a photoresist partial-reserved area and a photoresist fully-removed area;

Step 614: etching the mask material in the photoresist fully-removed area to form the first grid pattern region and the second grid pattern region;

Step 615: removing all the photoresist in the photoresist partial-reserved area, and removing a certain thickness of photoresist from the photoresist in the photoresist full-reserved area;

Step 616: etching the mask material in the photoresist partial-reserved area to form the barrier ring pattern;

Step 617: removing the remaining photoresist.

In one embodiment of the present disclosure, the fine metal mask fabricated according to the foregoing method is provided with the barrier ring pattern; then, when the fine metal mask is mounted onto the open mask, the presence of the barrier ring pattern in the fine metal mask can block dimensional deviation of the opening region of the open mask due to manufacturing accuracy and tension accuracy of the open mask, thereby avoiding the influence of the manufacturing accuracy and tension accuracy of the open mask onto the vapor evaporation process. Meanwhile, in the vapor evaporation process, the barrier ring pattern can prevent some evaporated material from passing through, so that a dummy display area will not be formed on the display substrate, and then a circuit contact area at a periphery of the display area on the display substrate can be approached to the display area, thereby achieving a slim border.

One embodiment of the present disclosure further provides an OLED display substrate, including a plurality of light-emitting units. The light-emitting units are formed by vapor evaporation with the mask assembly in any of the foregoing embodiments. The OLED display substrate in one embodiment of the present disclosure includes only a display area and does not include a dummy display area. A circuit contact area at a periphery of the display area can be approached to the display area, thereby achieving a slim border.

The above are merely the preferred embodiments of the present disclosure and shall not be used to limit the scope of the present disclosure. It should be noted that, a person skilled in the art may make improvements and modifications without departing from the principle of the present disclosure, and these improvements and modifications shall also fall within the scope of the present disclosure.

What is claimed is:

1. A fine metal mask, comprising:
    a mask pattern region; and
    a non-mask region disposed at a periphery of the mask pattern region;
    wherein the mask pattern region includes a first grid pattern region, a barrier ring pattern disposed around the first grid pattern region, and a second grid pattern region disposed at an outer periphery of the barrier ring pattern;
    wherein the first grid pattern region includes a plurality of grids defined by a plurality of first bars which extend along a first direction and a plurality of second bars which extend along a second direction and intersect with the first bars; the first direction is perpendicular to the second direction;
    a thickness of the barrier ring pattern in a third direction, is less than a thickness of the non-mask region in the third direction, and the third direction is perpendicular to the first direction and the second direction.

2. The fine metal mask according to claim 1, wherein the thickness of the barrier ring pattern in the third direction is equal to 0.4 to 0.8 of the thickness of the non-mask region in the third direction.

3. The fine metal mask according to claim 1, wherein the mask pattern region includes N first grid pattern regions, and N is a positive integer greater than or equal to 2.

4. The fine metal mask according to claim 1, wherein the barrier ring pattern is between the first grid pattern region and the second grid pattern region.

5. The fine metal mask according to claim 4, wherein each of the plurality of grids is corresponding to a light-emitting unit of a display substrate.

6. The fine metal mask according to claim 5, wherein the thickness of the barrier ring pattern in the third direction is less than a thickness of each of the plurality of grids in the third direction.

7. The fine metal mask according to claim 6, wherein the barrier ring pattern is an annular structure of a continuous wire; in a plane parallel to the fine metal mask, in a line width direction perpendicular to an extension direction of each portion of the wire, a line width of each portion of the wire is greater than or equal to a size in the line width direction of one of the plurality of grids.

8. The fine metal mask according to claim 6, wherein the thickness of each of the plurality of grids in the third direction is equal to the thickness of the non-mask region in the third direction.

9. The fine metal mask according to claim 1, wherein the mask pattern region includes a plurality of first grid pattern regions; and the plurality of first grid pattern regions are arranged in multiple rows and multiple columns.

10. The fine metal mask according to claim 9, wherein each of the plurality of first grid pattern regions is circular, and the barrier ring pattern is a circular ring.

11. A mask assembly, comprising:
    the fine metal mask according to claim 1;
    an open mask;
    wherein the fine metal mask is stacked on the open mask;
    the open mask includes a frame, a mask body disposed on the frame, and at least one opening region defined in the mask body;
    the opening region and the first grid pattern region have the same shape and are correspondingly arranged; an orthographic projection of an edge of the opening region to the fine metal mask falls within the barrier ring pattern at the periphery of the corresponding first grid pattern region.

12. The mask assembly according to claim 11, wherein the orthographic projection of the edge of the opening region to the fine metal mask falls at a middle position of the barrier ring pattern at the periphery of the corresponding first grid pattern region.

13. The mask assembly according to claim 11, wherein the open mask includes M×N opening regions, N is the number of first grid pattern regions of one fine metal mask, and M is the number of the fine metal masks; M fine metal masks are arranged in an array; N is a positive integer greater than or equal to 2, and M is a positive integer greater than or equal to 2.

14. The mask assembly according to claim 11, wherein the barrier ring pattern is between the first grid pattern region and the second grid pattern region.

15. The mask assembly according to claim 14, wherein each of the plurality of grids is corresponding to a light-emitting unit of a display substrate.

16. The mask assembly according to claim 15, wherein the thickness of the barrier ring pattern in the third direction is less than a thickness of each of the plurality of grids in the third direction.

17. The mask assembly according to claim 16, wherein the barrier ring pattern is an annular structure of a continuous wire; in a plane parallel to the fine metal mask, in a line width direction perpendicular to an extension direction of each portion of the wire, a line width of each portion of the wire is greater than or equal to a size in the line width direction of one of the plurality of grids.

18. A method for manufacturing a fine metal mask, comprising:
    forming a fine metal mask in such a manner that the fine metal mask includes a mask pattern region and a non-mask region disposed at a periphery of the mask pattern region, the mask pattern region includes at least one first grid pattern region, a barrier ring pattern disposed around the first grid pattern region, and a second grid pattern region disposed at an outer periphery of the barrier ring pattern;
    wherein the first grid pattern region includes a plurality of grids defined by a plurality of first bars which extend along a first direction and a plurality of second bars which extend along a second direction and intersect with the first bars; the first direction is perpendicular to the second direction;
    a thickness of the barrier ring pattern in a third direction, is less than a thickness of the non-mask region in the third direction, and the third direction is perpendicular to the first direction and the second direction.

19. The method according to claim 18, wherein the forming a fine metal mask includes:
    providing mask material;
    coating a photoresist on the mask material;

etching the photoresist with a halftone or gray-tone mask to form a photoresist full-reserved area, a photoresist partial-reserved area and a photoresist fully-removed area;

etching the mask material in the photoresist fully-removed area to form the first grid pattern region and the second grid pattern region;

removing all the photoresist in the photoresist partial-reserved area, and removing a certain thickness of photoresist from the photoresist in the photoresist full-reserved area;

etching the mask material in the photoresist partial-reserved area to form the barrier ring pattern;

removing remaining photoresist.

\* \* \* \* \*